United States Patent
Maruyama et al.

(10) Patent No.: US 9,034,772 B2
(45) Date of Patent: May 19, 2015

(54) ETCHING METHOD

(71) Applicant: Tokyo Electron Limited, Tokyo (JP)

(72) Inventors: Koji Maruyama, Miyagi (JP); Mikio Yamamoto, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 13/945,203

(22) Filed: Jul. 18, 2013

(65) Prior Publication Data

US 2014/0024221 A1 Jan. 23, 2014

(30) Foreign Application Priority Data

Jul. 20, 2012 (JP) ................. 2012-161879

(51) Int. Cl.
| | |
|---|---|
| *H01L 21/302* | (2006.01) |
| *H01L 21/461* | (2006.01) |
| *C23F 1/00* | (2006.01) |
| *C23F 3/00* | (2006.01) |
| *H01L 21/306* | (2006.01) |
| *H01L 21/3065* | (2006.01) |
| *H01L 21/768* | (2006.01) |
| *H01L 21/308* | (2006.01) |
| *H01J 37/32* | (2006.01) |

(52) U.S. Cl.
CPC ...... *H01L 21/3065* (2013.01); *H01L 21/76898* (2013.01); *H01L 21/3081* (2013.01); *H01J 37/32449* (2013.01); *H01J 37/32706* (2013.01); *H01J 2237/334* (2013.01)

(58) Field of Classification Search
CPC .............. H01L 21/76805; H01L 21/76898; C23F 1/12
USPC ............... 216/67, 79; 156/345.43; 438/719
See application file for complete search history.

(56) References Cited

U.S. PATENT DOCUMENTS

2009/0184089 A1* 7/2009 Chebi et al. ............... 216/13
2012/0074570 A1* 3/2012 Kolb et al. ............... 257/751

OTHER PUBLICATIONS

S. Wolf and R.N. Tauber, "Silicon Processing for the VLSI Era, vol. 1—Process Technology", Lattice Press, California, 1986, pp. 521-535.*

(Continued)

*Primary Examiner* — Binh X Tran
*Assistant Examiner* — Thomas Pham
(74) *Attorney, Agent, or Firm* — IPUSA, PLLC

(57) ABSTRACT

A method of etching a substrate by plasma via a mask having a predetermined pattern at back of a silicon layer of the substrate, a semiconductor device being formed at front of which supported by a support substrate, includes a main etching step in which plasma is generated by supplying a process gas including a mixed gas whose flow ratio of fluorine compound gas, oxygen gas and silicon fluoride gas is 2:1:1.5 or a process gas including a mixed gas in which at least the ratio of one of the oxygen gas and the silicon fluoride gas, using the fluorine compound gas as a standard, is larger than the above ratio, and the substrate is etched by the plasma; and an over etching step in which the substrate is further etched by plasma while applying a high frequency for bias whose frequency is less than or equal to 400 kHz.

7 Claims, 14 Drawing Sheets

(56) References Cited

OTHER PUBLICATIONS

Suppression of notching by lowering the bias frequency in electron cyclotron resonance plasma with a divergent magnetic field, H. Morioka, D. Matsunaga, and H. Yagi, ULSI Development Division, Fujitsu Limited, 1998.

Advanced electron cyclotron resonance plasma etching technology for precise ultra-large-scale integration patterning, Seiji Samukawa, LSI Basic Research Laboratory, Microelectronics Research Laboratories, NEC Corporation, 1994.

* cited by examiner

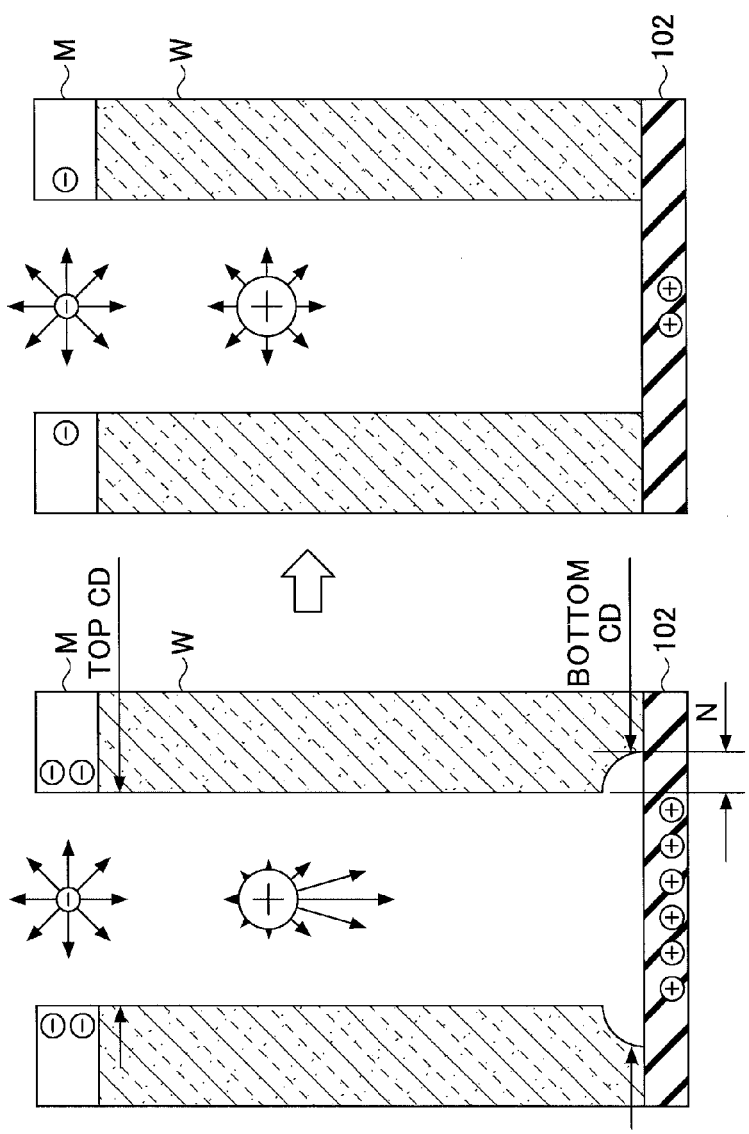

LF=13.56MHz

N=1.64 μm

LF=400kHz

N=0.51 μm

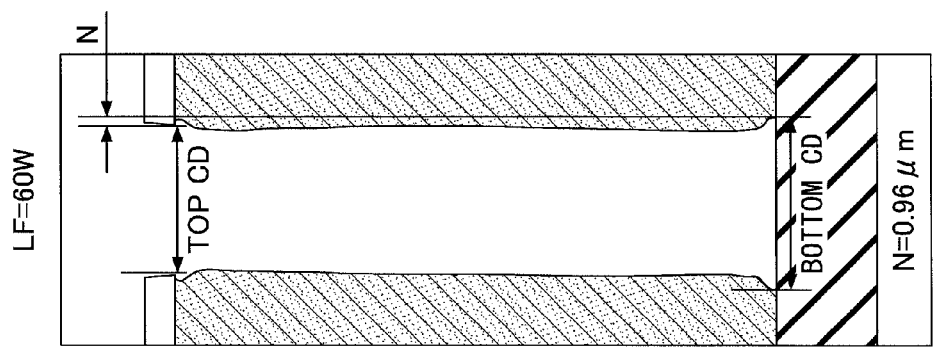
FIG.13A LF=60W
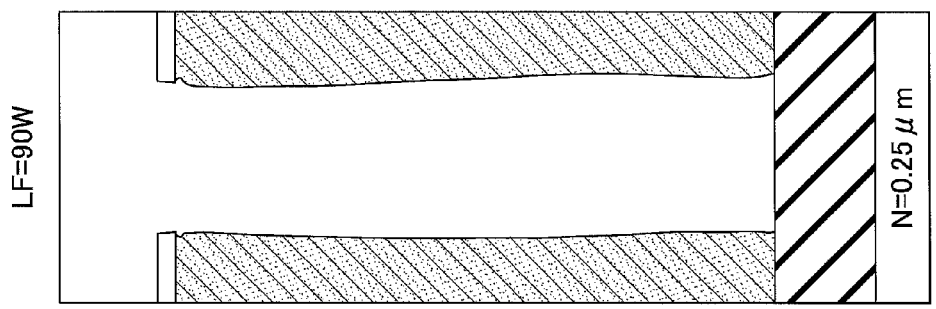
FIG.13B LF=90W
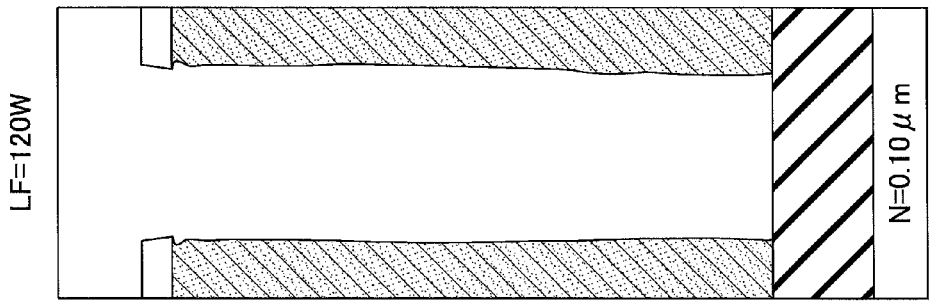
FIG.13C LF=120W

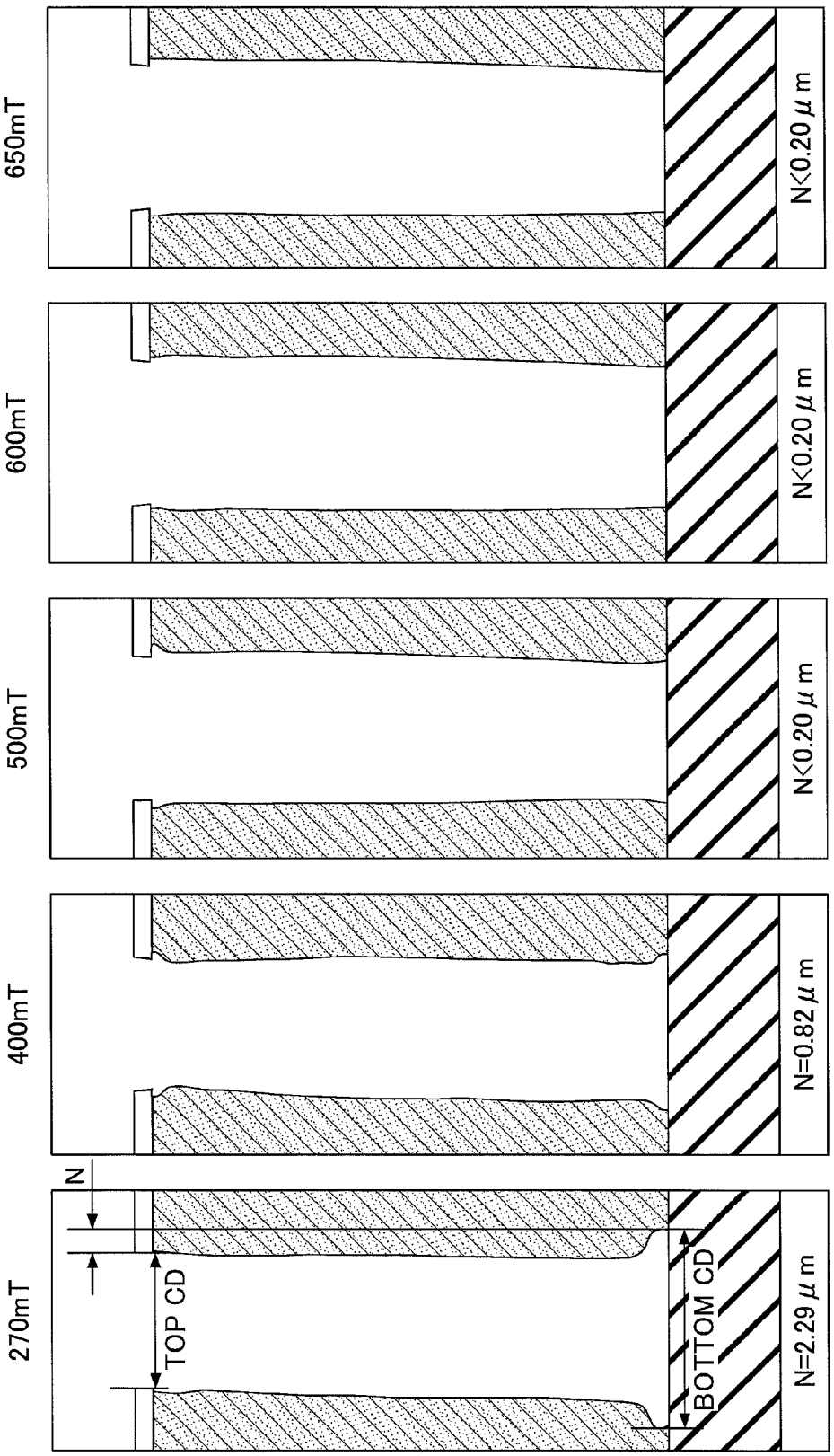

ETCHING METHOD

CROSS-REFERENCE TO RELATED APPLICATION

The present application is based on and claims the benefit of priority of Japanese Priority Application No. 2012-161879 filed on Jul. 20, 2012, the entire contents of which are hereby incorporated herein by reference.

BACKGROUND OF THE INVENTION

1. Field of the Invention

The present invention relates to an etching method.

2. Description of the Related Art

A process to form a Through-Silicon Via (TSV) for a three-dimensional packaging includes steps of reversing a substrate, to be processed, in upward and downward directions and bonding the substrate with a support substrate. In these steps, a front surface side of the substrate in which a semiconductor device such as the TSV or the like is formed is bonded to the support substrate by an adhesive agent, a back side surface of the substrate is grinded to make the substrate thinner, and then a silicon layer of the substrate is etched by plasma via a mask having a predetermined pattern. According to the etching method, it is necessary to optimize a process condition regarding positions of the semiconductor device, the adhesive agent, and the like when etching the substrate from the back side surface thereof because the bonded structure of the substrate, which is to be etched, has a specific structure. Furthermore, it is important to optimize a process condition for actualizing a high etching rate and uniformity in etching shapes, and suppressing notching generated at an interface between the silicon layer and an insulating film provided below the silicon layer.

For such a process condition for etching silicon, for example, non-Patent Document 1 discloses a relationship between pressure conditions and notching when a desired high frequency for bias (a high bias frequency) in Electron Cyclotron Resonance (ECR) is applied. Further, non-Patent Document 2 discloses a relationship between ion densities in plasma and notching.

However, non-Patent Documents 1 and 2 do not disclose an optimization of a process condition when etching a silicon layer of a substrate, to be processed, that is a bonded structure of the substrate, reversed in upward and downward directions, and a support substrate.

Further, when etching the substrate of the bonded structure, if a reaction product is deposited on an etched surface of the substrate, there is a possibility that an influence occurs on the semiconductor device formed in the substrate or the adhesive agent that bonds the support substrate when removing the deposited reaction product. Thus, it is desired to provide an optimization of a process condition in which a reaction product caused by etching is not generated.

In TSV etching, mainly, it is necessary to actualize a high silicon etching rate and suppress notching generated at an interface between a silicon layer and an insulating film provided below the silicon layer. Then, as a general etching shape, there may be a case that an insulating film (generally, silicon oxide film ($SiO_2$)) is exposed at a bottom of a via generated by etching.

In a general silicon etching, a high silicon etching rate is actualized by applying a high power or the like, by increasing selectivity between a resist film and a silicon film by depositing a deposited component of a kind of oxide film on the resist film, prior to etching or at the same time with etching.

However, there is a problem wherein gas for removing the resist after etching the silicon etches the insulating film exposed at the bottom of the via.

RELATED ART

Non-Patent Documents

[Non-Patent Document 1] Suppression of notching by lowering the bias frequency in electron cyclotron resonance plasma with a divergent magnetic field, H. Morioka, D. Matsunaga, and H. Yagi, ULSI Development Division, Fujitsu Limited

[Non-Patent Document 2] Advanced electron cyclotron resonance plasma etching technology for precise ultra-large-scale integration patterning, Seiji Samukawa, LSI Basic Research Laboratory, Microelectronics Research Laboratories, NEC Corporation

SUMMARY OF THE INVENTION

The present invention is made in light of the above problems, and provides a method capable of appropriately etching a substrate, to be processed, on which a semiconductor device is formed.

According to an embodiment, there is provided a method of etching a substrate, to be processed, by plasma via a mask formed to have a predetermined pattern at a back side surface of a silicon layer of the substrate wherein a semiconductor device is formed at a front surface side of the substrate that is supported by a support substrate, including a main etching step in which plasma is generated by supplying a process gas including a mixed gas whose flow ratio of fluorine compound gas, oxygen gas and silicon fluoride gas is 2:1:1.5 or a process gas including a mixed gas in which at least the ratio of one of the oxygen gas and the silicon fluoride gas, using the fluorine compound gas as a standard, is larger than the ratio of 2:1:1.5, and the substrate is etched by the generated plasma; and an over etching step, after the main etching step, in which the substrate is further etched by plasma while applying a high frequency for bias whose frequency is less than or equal to 400 kHz.

BRIEF DESCRIPTION OF THE DRAWINGS

Other objects, features and advantages of the present invention will become more apparent from the following detailed description when read in conjunction with the accompanying drawings.

FIG. 10A to FIG. 10C are views for explaining behaviors of ions and electrons in a high pressure process of the embodiment;

FIG. 13A to FIG. 13C are respective views illustrating a relationship between electric power of the high frequency for bias LF and notching in the over etching step of the embodiment; and FIG. 14A to FIG. 14E are respective views illustrating a relationship between pressure and notching in the over etching step of the embodiment.

DETAILED DESCRIPTION OF THE PREFERRED EMBODIMENTS

Figure 1:
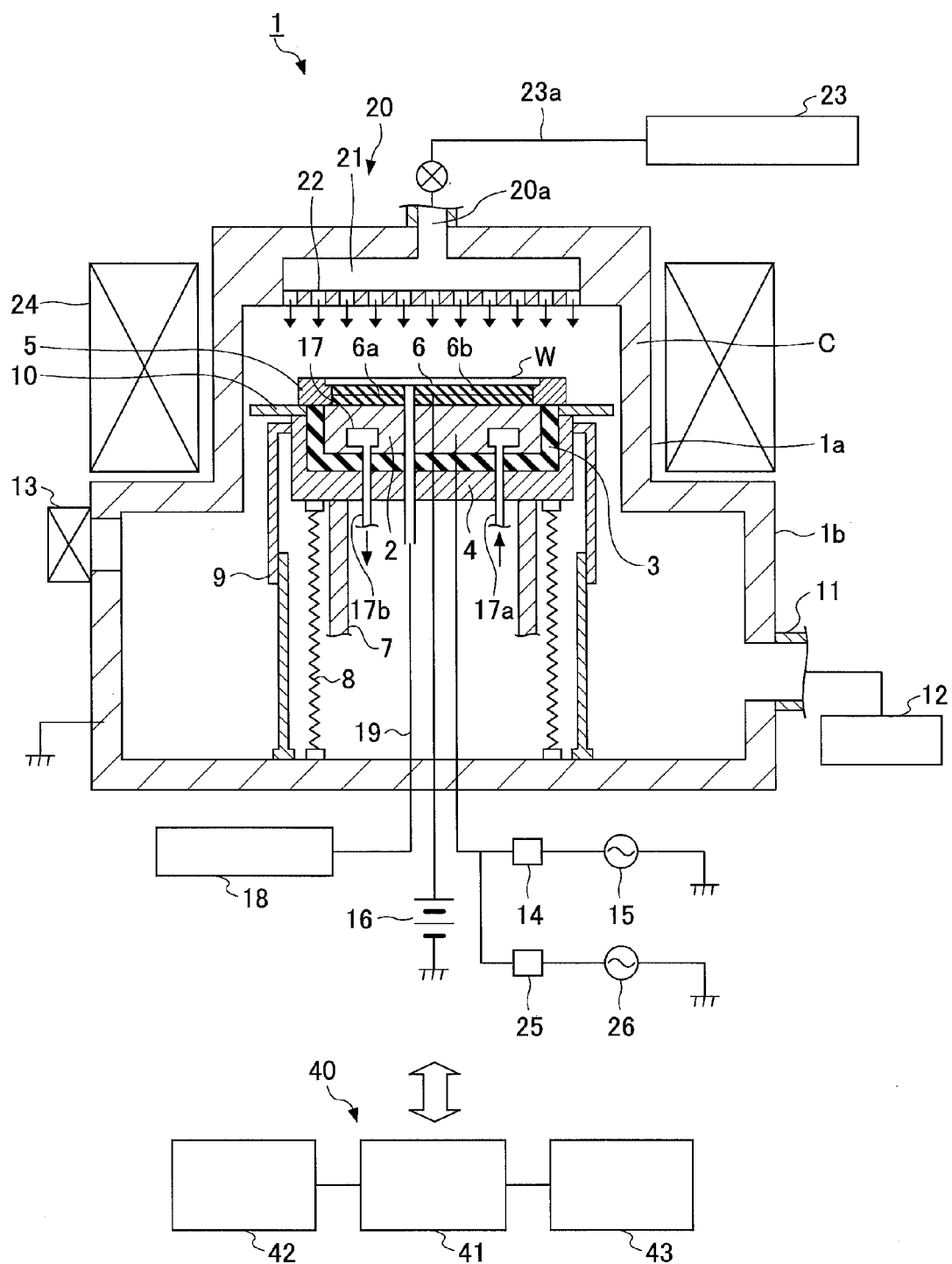
FIG. 1 is a view illustrating an entire structure of a plasma etching apparatus of an embodiment.

The invention will be described herein with reference to illustrative embodiments. It is to be noted that, in the explanation of the drawings, the same components are given the same reference numerals, and explanations are not repeated.
[Entire Structure of Plasma Etching Apparatus]

Figure 2:
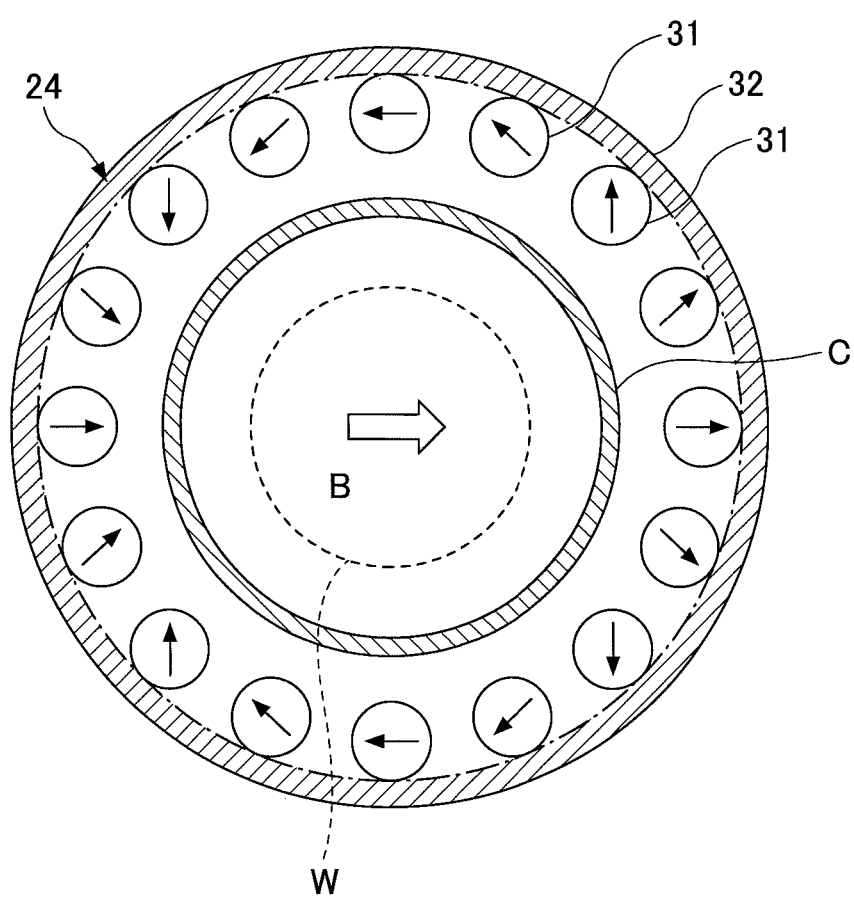
FIG. 2 is a lateral cross-sectional view schematically illustrating a dipole ring magnet illustrated in FIG. 1.

First, a structure of a plasma etching apparatus that uses a method of an embodiment is explained with reference to FIG. 1 and FIG. 2. FIG. 1 is a vertical cross-sectional view illustrating an entire structure of a plasma etching apparatus 1 of the embodiment. FIG. 2 is a lateral cross-sectional view of a dipole ring magnet 24 illustrated in FIG. 1.

The plasma etching apparatus 1 is configured as a plasma etching apparatus of a magnetron Reactive Ion Etching (RIE), and includes a chamber C made of metal such as aluminium, stainless steel or the like, for example.

In the chamber C, a susceptor 2 for mounting a silicon wafer (hereinafter, simply referred to as a "wafer") W, for example, is provided. The susceptor 2 is made of aluminium, for example, and is supported by a support portion 4 made of a conductive material via an insulating member 3. A focus ring 5 made of quartz, for example, is provided at a periphery of an upper surface of the susceptor 2. An electrostatic chuck 6 is provided at the upper surface of the susceptor 2 for supporting the wafer W by an electrostatic attraction. The susceptor 2 and the support portion 4 are movable in upper and lower directions by an elevating mechanism including a ball screw 7 and an elevating drive unit (not illustrated in the drawings), provided below the support portion 4, is covered by a bellows 8 made of stainless steel. A bellows cover 9 is provided outside the bellows 8. A lower surface of the focus ring 5 is connected to a baffle plate 10, and the focus ring 5 is electrically connected to the chamber C via the baffle plate 10, the support portion 4 and the bellows 8. The chamber C is grounded.

The chamber C includes an upper portion 1a and a lower portion 1b having a larger diameter than that of the upper portion 1a. The chamber C is provided with an air exhaust 11 at a side wall of the lower portion 1b, which is a part of the chamber C and having a relatively larger diameter, and an evacuation device 12 is connected to the air exhaust 11 via an exhaust pipe. A process space in the chamber C is decompressed to a predetermined degree of vacuum by operating a vacuum pump of the evacuation device 12. The chamber C is provided with a gate valve 13 at a side wall of the lower portion 1b for opening and closing a transferring port of the wafer W.

A first high frequency power source 15 for plasma generation and Reactive Ion Etching (RIE) is electrically connected to the susceptor 2 via a matching unit 14. The first high frequency power source 15 supplies a high frequency electric power with a frequency of 100 MHz, for example, as a high frequency electric power for plasma generation to a lower electrode, in other words, the susceptor 2.

Further, a second high frequency power source 26 is electrically connected to the susceptor 2 via a matching unit 25. The second high frequency power source 26 supplies a high frequency electric power with a frequency of 400 kHz, for example, as a high frequency electric power for bias to the susceptor 2 in a superimposed manner.

A shower head 20, which will be explained later, is provided at a ceiling portion of the chamber C as a grounded upper electrode. Thus, the first high frequency electric power from the first high frequency power source 15 is supplied between the susceptor 2 and the shower head 20.

The electrostatic chuck 6 includes a pair of insulating sheets 6b and an electrode 6a made of a conductive film and interposed between the pair of insulating sheets 6b. A direct current power source 16 is electrically connected to the electrode 6a. The wafer W is attracted to the electrostatic chuck 6 by the electrostatic attraction generated by direct-current voltage from the direct current power source 16.

A coolant room 17 that extends in a circumferential direction is provided inside the susceptor 2, for example. Coolant such as cooling water, at a predetermined temperature, is provided, in a circulatory manner, to the coolant room 17 from an external chiller unit (not illustrated in the drawings) via pipes 17a and 17b. The wafer W provided on the susceptor 2 is controlled to be a predetermined process temperature by the temperature of the circulated coolant.

Further, a cooling gas such as He gas, for example, from a gas introduction mechanism 18 is supplied between an upper surface of the electrostatic chuck 6 and a back surface of the wafer W via a gas supply line 19. The gas introduction mechanism 18 is configured such that the gas pressures, in other words, back pressures, at the center portion of the wafer and the peripheral portion of the wafer are independently controlled in order to increase across-the-wafer uniformity in an etching process.

The shower head 20 provided at the ceiling portion of the chamber C is provided with a plurality of gas discharging ports 22 at a lower surface that horizontally faces an upper surface of the susceptor 2. A buffer room 21 is provided inside a gas discharging surface. A gas supply source 23 is connected to a gas introduction port 20a of the buffer room 21 via a gas supply pipe 23a.

A process gas including a mixed gas of fluorine compound gas, oxygen gas and silicon fluoride gas is supplied from the gas supply source 23. Sulfur hexafluoride ($SF_6$) gas (hereinafter referred to as "$SF_6$ gas") may be used as the fluorine compound gas, for example. Further, silicon tetrafluoride ($SiF_4$) gas (hereinafter referred to as "$SiF_4$ gas") may be used as the silicon fluoride gas, for example. Silicon chloride ($SiCl_4$) gas may be used instead of $SiF_4$ gas. The process gas may include inert-gas such as argon (Ar) gas or the like in addition to the above described gasses. In this embodiment, a gas including a mixed gas of sulfur hexafluoride ($SF_6$) gas, oxygen ($O_2$) gas and silicon tetrafluoride ($SiF_4$) gas is used as the process gas.

The dipole ring magnet 24 that circularly or concentrically extends is provided at a periphery of the upper portion 1a of the chamber C. As illustrated in FIG. 2, which is a lateral cross-sectional view, the dipole ring magnet 24 includes a ring-shaped magnetic casing 32 and a plurality of, for example, 16 anisotropy segment columnar magnets 31 aligned along a circumferential direction with a predetermined space. In FIG. 2, arrows illustrated in the anisotropy segment columnar magnets 31 express directions of magnetization directions, respectively. By gradually shifting the magnetization directions of the anisotropy segment columnar magnets 31 as illustrated in FIG. 2, a horizontal magnetic field B directing to a single direction can be generated in total.

Thus, an RF electric field in a vertical direction is generated due to the high frequency electric power by the first high frequency power source 15 and a magnetic field in a horizontal direction is generated by the dipole ring magnet 24, in a space between the susceptor 2 and the shower head 20. High density plasma is generated in the vicinity of the surface of the susceptor 2 by a magnetron discharge using the orthogonal electromagnetic field.

The entirety of the plasma etching apparatus is controlled by a control unit 40. The control unit 40 includes a Central Processing Unit (CPU) 41, a Read Only Memory (ROM) 42 and a Random Access Memory (RAM) 43. The CPU 41 executes a plasma process in accordance with various recipients stored in these memory areas. In each of the recipients, control information for the apparatus in accordance with a process condition such as process period, temperature in a process room (temperature of the upper electrode, sidewall temperature of the process room, ESC temperature or the like), pressure (evacuation of gasses), high frequency electric power or voltage, flow rates of various process gasses, flow rates of heat-transferring gasses or the like are described.

The functions of the control unit 40 may be actualized by operating using software or operating using hardware.

In the plasma etching apparatus configured as described above, for performing plasma etching, first, the gate valve 13 is opened, and the wafer W is introduced into the chamber C to be mounted on the susceptor 2. Then, the susceptor 2 on which the wafer W is mounted is elevated to a position as illustrated and the chamber C is evacuated by the vacuum pump of the evacuation device 12 via the air exhaust 11. Then, process gas is introduced into the chamber C at a predetermined flow rate from the gas supply source 23 to set the pressure in the chamber C to be a predetermined set value. Further, high frequency electric power with a predetermined electric power from the first high frequency power source 15 is applied to the susceptor 2. Further, direct voltage from the direct current power source 16 is applied to the electrode 6a of the electrostatic chuck 6 to fix the wafer W to the susceptor 2. The process gas introduced from the shower head 20 is ionized or dissociated by magnetron discharge to generate plasma. Then, the wafer W is etched by radical or ion included in the generated plasma.

The entire structure of the plasma etching apparatus 1 of the embodiment is explained above. Next, a bonded structure of a substrate, to be processed, which is an object to be etched according to the embodiment, and a support substrate is explained.

[Bonding of Substrate and Support Substrate]

Figure 3A:
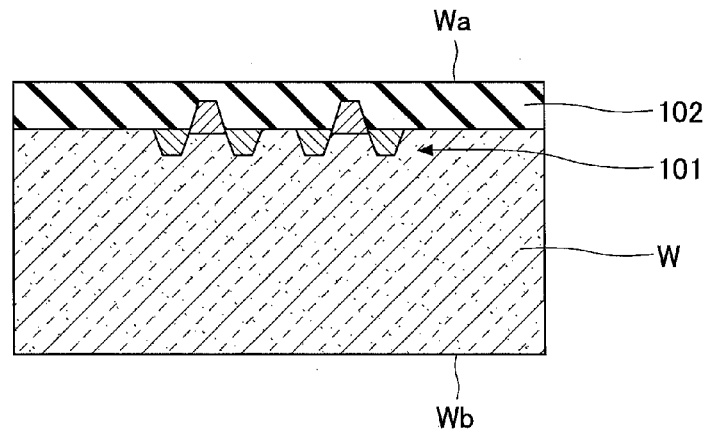
FIG. 3A to FIG. 3C are cross-sectional views schematically illustrating a manufacturing process of a semiconductor device of the embodiment.
Figure 3B:
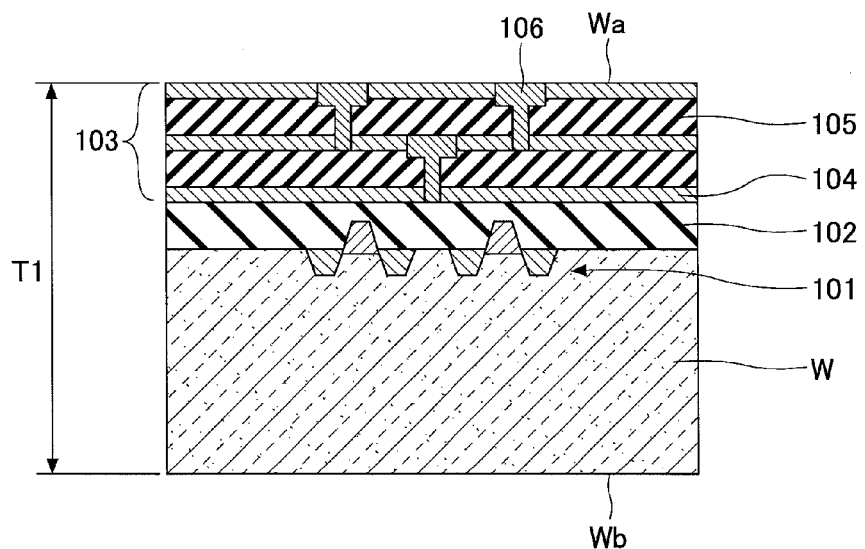
Figure 3C:
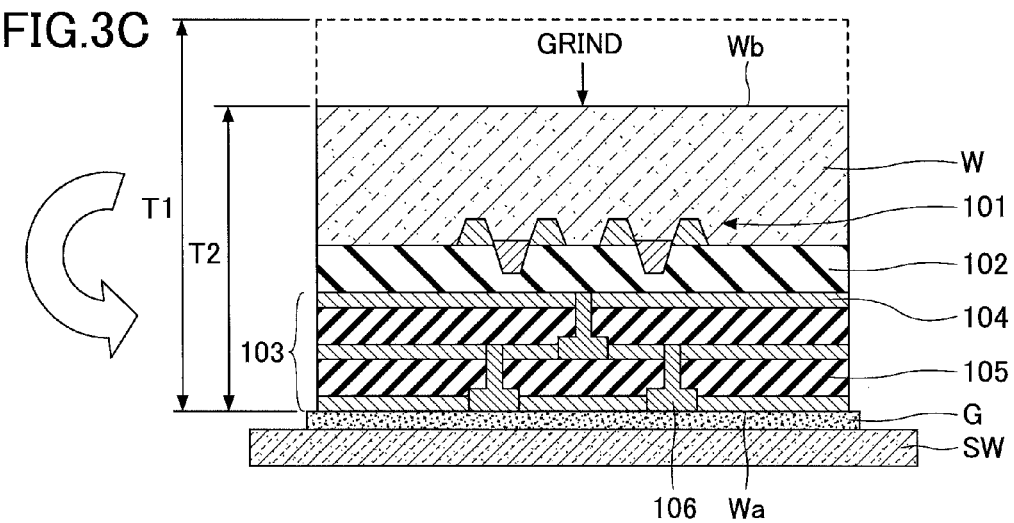
Figure 4A:
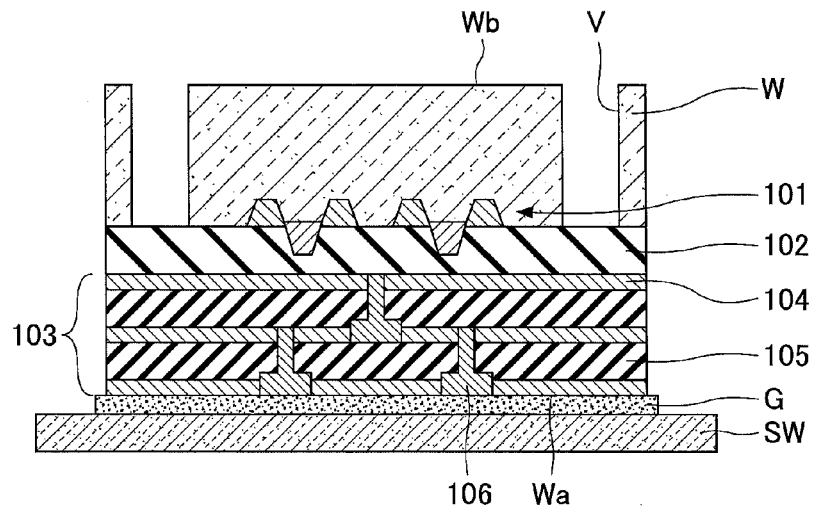
FIG. 4A to FIG. 4C are cross-sectional views schematically illustrating a manufacturing method of the semiconductor device subsequent to the step illustrated in FIG. 3C.
Figure 4B:
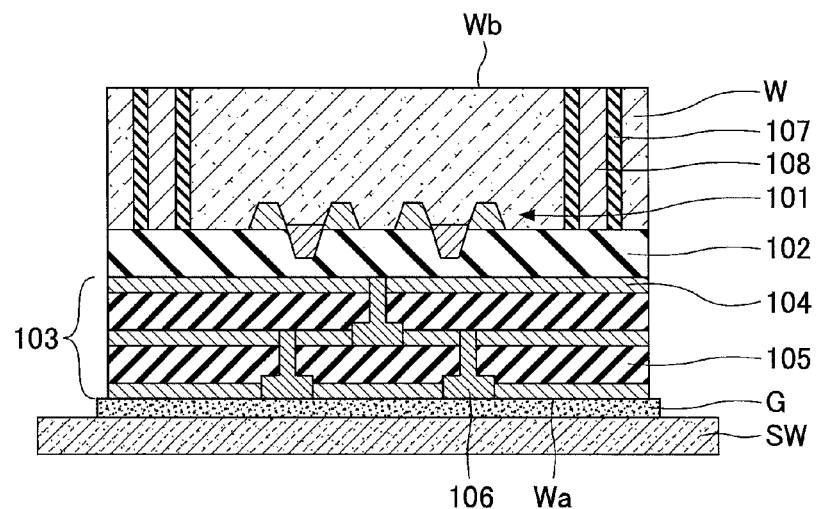
Figure 4C:
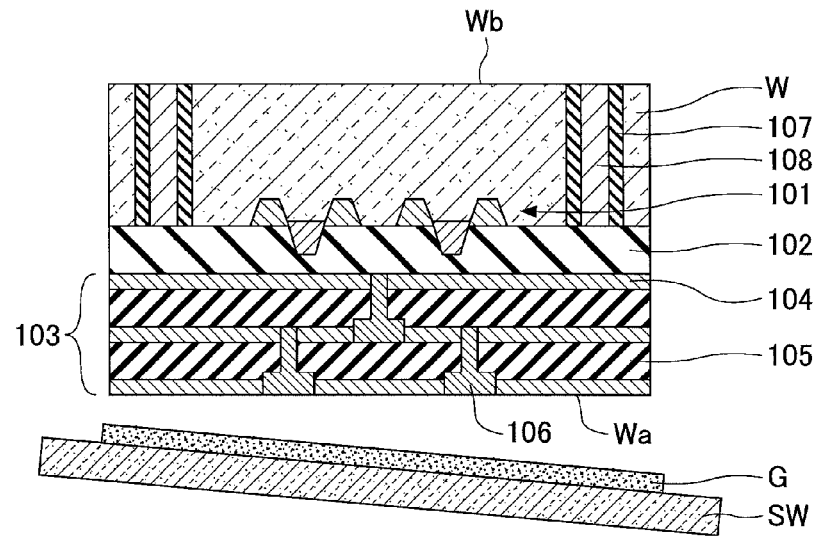

In this embodiment, steps for bonding a substrate, to be processed, in which TSV (Through-Silicon Via) for a three-dimensional packaging is formed and a support substrate are explained with reference to FIG. 3A to FIG. 3C and FIG. 4A to FIG. 4C. FIG. 3A to FIG. 3C are cross-sectional views schematically illustrating a manufacturing method of the semiconductor device of the embodiment. FIG. 4A to FIG. 4C are cross-sectional views schematically illustrating a manufacturing method subsequent to the step illustrated in FIG. 3C.

As illustrated in FIG. 3C, a bonded wafer includes a device wafer W, which is an example of a substrate, to be processed, and a support wafer SW, which is an example of a support substrate. In FIG. 3C, the device wafer W is reversed in upward and downward directions. The device wafer W is a substrate on a front surface Wa of which semiconductor devices such as transistors or the like are formed. The support wafer SW is provided to strengthen the thinned device wafer W when a back surface Wb of the device wafer W is grinded to be thinner. The device wafer W is bonded to the support wafer SW via an adhesive agent G.

According to the method of manufacturing the semiconductor device of the embodiment, first, as illustrated in FIG. 3A, transistors 101 are formed at a front surface of the device wafer W made of a silicon wafer or the like and an interlayer insulating film 102 is formed on the device wafer W on which the transistors 101 are formed.

Then, a wiring structure 103 is formed on the interlayer insulating film 102. As illustrated in FIG. 3B, the wiring structure 103 includes a stacked structure of wiring layers 104 and insulating films 105 that are alternately stacked on the interlayer insulating film 102 and is provided with vias 106 that penetrate the insulating films 105 to electrically connect the wiring layers 104 provided above and below the respective wiring layer 104.

Then, as illustrated in FIG. 3C, the bonded structure of the substrate and the support substrate is actualized by reversing the device wafer W in upward and downward directions and bonding the front surface Wa of the device wafer W with the support wafer SW via the adhesive agent G. The support wafer SW functions as a support body that strengthens the thinned device wafer W and prevents warping of the thinned device wafer W, when the back surface Wb of the device wafer W is grinded to be thinner. The support wafer SW is made of silicon wafer or the like, for example. Then, the bonded wafer is supported by, for example, a support portion, not illustrated in the drawings, provided in a grinding device and the back surface Wb side of the wafer W is grinded to have the thickness of the device wafer W to be a predetermined thickness T2 from the thickness T1 of which before being grinded. The predetermined thickness T2 may be 50 to 200 µm, for example.

Here, in FIG. 3A to FIG. 3C and FIG. 4A to FIG. 4C, in order to facilitate illustration, the thicknesses of the interlayer insulating film 102 and the wiring structure 103 are illustrated in an enlarged manner. However, actually, the thicknesses of the interlayer insulating film 102 and the wiring structure 103 are extremely thinner than the thickness of a base body of the wafer W.

Then, a resist pattern, not illustrated in the drawings, is formed by coating resist on the back surface Wb of the wafer W, exposing and developing. Then, the etching method of the embodiment in which the back surface Wb of the wafer W is etched, which will be explained later, is performed using the resist as an etching mask to form vias V. Then, the resist remaining at the back surface Wb of the wafer W where the vias V are generated, as illustrated in FIG. 4A, is removed by aching. The diameter of the via V may be, for example, 1 to 10 µm. Further, the depth of the via V corresponds to the thickness of the wafer W after being made to be thinner by grinding the back surface Wb of the wafer W, and may be 50 to 200 μm, for example.

Next, as illustrated in FIG. 4B, an insulating film 107 such as polyimide or the like, for example, is formed to cover inside surfaces of the vias V. Then, through electrodes 108 are formed by electroplating or the like in the vias V, respectively, inside surfaces of which are covered by the insulating film 107.

Next, as illustrated in FIG. 4C, by peeling the support wafer SW from the wafer W, the wafer W that is made to be thinner and is provided with the through electrodes 108 is obtained. The support wafer SW can be peeled by lowering an adhesive force of the photoreactive adhesive agent G by irradiating ultraviolet light (UV light), for example.

The bonded structure of the substrate and the support substrate is explained above. Next, the etching method of the embodiment is explained.

[Etching Method]

In the etching method of the embodiment, the substrate, which is bonded as described above, is etched by plasma via a mask having a predetermined pattern at the back side surface side of the substrate. In TSV etching, it is necessary to actualize a high silicon etching rate and suppress notching generated at an interface between a silicon layer and an insulating film provided below the silicon layer. Then, as a general etching shape, there may be a case that an insulating film (generally, silicon oxide film ($SiO_2$)) is exposed at a bottom portion of a via generated by etching.

In a general silicon etching, a high etching rate is actualized by applying a high power or the like, by increasing selectivity between a resist film and a silicon film by depositing a deposited component of a kind of oxide film on a resist film, prior to etching or at the same time with the etching. However, there is a problem wherein gas for removing the resist after etching the silicon etches the insulating film exposed at the bottom of the via.

Further, in the etching method of the embodiment, when forming the vias V illustrated in FIG. 4A, a main etching (ME) step in which the silicon layer is etched from the back surface Wb side of the wafer W, and an over etching (OE) step in which the silicon layer in the vicinity of the bottom portion of the vias V is etched in order to expose the interlayer insulating film 102 adjacent to the silicon layer, after the main etching step, are performed. In the following, first, an optimization of a process condition in the main etching step is explained, and thereafter, an optimization of a process condition in the over etching step is explained.

[Main Etching Step]

In the etching method of the embodiment, deposition gas is not added as the process gas in order not to cause a problem wherein the gas for removing the resist in the etching of the wafer W of the above described bonded structure etches the insulating film exposed at the bottom portion of the vias V as well. Thus, according to the etching method of the embodiment, it is unnecessary to provide a removing step of a protection film that is formed by depositing a deposited component of a kind of oxide film on the resist film. In the following, optimization of a kind of gas and flow rate of the process gas used in the etching method of the embodiment is explained. (Kind of Gas and Flow Rate of Gas)

Figure 5:
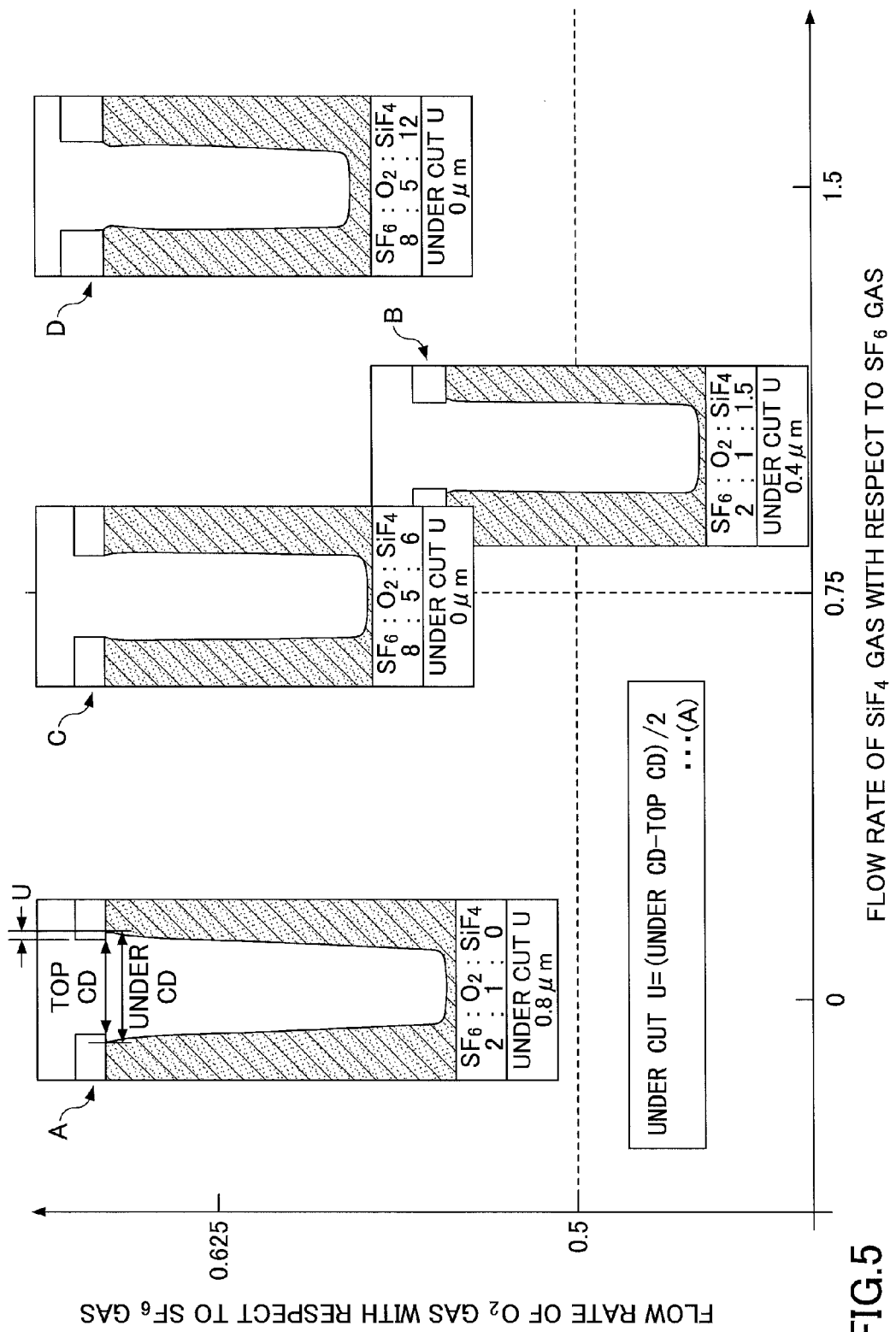
FIG. 5 is a view illustrating a relationship between flow ratio of process gas, etching shape, and under cut in a main etching step of the embodiment.

FIG. 5 is a view illustrating a relationship between a shape of the formed via V and under cut, when flow ratio of $SF_6$ gas/$O_2$ gas/$SiF_4$ gas is varied in the main etching step of the embodiment. The process condition at this time is explained in the following.

Process Condition
Pressure: 40 Pa (=300 mT)
Frequency of high frequency for plasma generation HF: 100 MHz
Electric power of high frequency for plasma generation HF: 4.8 kW (electric power per unit area: 6.79 W/cm$^2$)
Electric power of low high frequency for bias LF: not applied
Kind of gas: $SF_6$ gas/$O_2$ gas/$SiF_4$ gas In FIG. 5, "A" to "D" illustrate etching results when the flow ratio of the process gas is varied in which above described $SF_6$ gas/$O_2$ gas/$SiF_4$ gas are mixed. In FIG. 5, horizontal axis indicates the flow ratio of $SiF_4$ gas when the flow ratio of $SF_6$ gas is 1, and vertical axis indicates the flow ratio of $O_2$ gas when the flow ratio of $SF_6$ gas is 1.

In FIG. 5, "A" illustrates a via shape when the flow ratio of the process gas was set as $SF_6$ gas/$O_2$ gas/$SiF_4$ gas=2:1:0 (it means that $SiF_4$ gas is not added). At this time, etching rate of the silicon layer becomes higher as the flow rate of $SF_6$ gas that mainly contributes etching of the silicon layer is increased for an amount of $SiF_4$ gas that is not provided. However, at this time, the sidewall of the via formed in the silicon layer is etched in a lateral direction as well. This phenomenon is called "under cut". In this embodiment, the "under cut" is evaluated by an etched amount with respect to a top Critical Dimension (CD) of the silicon layer at an uppermost portion. The etched amount may be evaluated by measuring an under CD, which is the most etched portion, directly below the top CD. As illustrated in FIG. 5, the under cut U is calculated by the following equation (A) in this embodiment.

$$\text{under cut } U \text{ (one side)} = (\text{under CD} - \text{top CD})/2 \tag{A}$$

For the case "A" of FIG. 5, the under cut is 0.8 μm.

Then, the silicon layer was etched using process gas in which $SiF_4$ gas is added. The results are illustrated as "B", "C" and "D" in FIG. 5. In FIG. 5, "B" expresses a via shape when the flow ratio of the process gas was set as $SF_6$ gas/$O_2$ gas/$SiF_4$ gas=2:1:1.5. In this case, by adding $SiF_4$ gas, the etching rate of the silicon layer is lowered compared with the case of "A" in FIG. 5 as the flow rate of $SF_6$ gas is relatively decreased. Thus, the depth of the via becomes shallower. However, the under cut U to the sidewall of the via formed in the silicon layer becomes a half of that of the case "A" in FIG. 5. Thus, it is revealed that a good etching shape in which the sidewall of the via is more straight can be obtained.

For the case of "C" in FIG. 5, the flow ratio of the process gas was set as $SF_6$ gas/$O_2$ gas/$SiF_4$ gas=8:5:6 (2:1.25:1.5) where the flow ratio of $O_2$ gas is increased compared with the case of "B" in FIG. 5. In this case, etching rate of silicon layer was almost the same as the case of "B" in FIG. 5, the under cut U became "0" and the etching shape became better.

For the case of "D" in FIG. 5, the flow ratio of the process gas was set as $SF_6$ gas/$O_2$ gas/$SiF_4$ gas=8:5:12 (2:1.25:3), where the flow rate of $SiF_4$ gas is increased compared with the case of "C" in FIG. 5. In this case, it is revealed that the etching rate of the silicon layer and the under cut U were the same as those for the case "C" in FIG. 5.

As described above, for optimizing a kind of gas and flow rate of the gas, it is revealed that a mixture gas of $SF_6$ gas/$O_2$ gas/$SiF_4$ gas, where $SiF_4$ gas was added, is appropriate to be used in order to reduce the under cut U of the sidewall of the via formed in the silicon layer. With this configuration, by adding $SiF_4$ gas, the following chemical reaction can be promoted.

$$SiF_x + O \rightarrow SiOF_x$$

As a result, a protective film of $SiOF_x$ is formed at the sidewall of the via formed in the silicon layer so that a progression of etching in a lateral direction can be suppressed.

However, if the flow rate of the $SiF_4$ gas increases, the flow rate of the $SF_6$ gas is relatively decreased. If the flow rate of the $SF_6$ gas becomes decreased, the etching rate of the silicon layer is also decreased. Therefore, it is necessary to retain the flow rate of the $SF_6$ gas to a certain extent. Thus, according to the etching method of the embodiment, the main etching step is performed using a mixture gas of $SF_6$ gas/$O_2$ gas/$SiF_4$ gas whose flow ratio is 2:1:1.5 (=$SF_6$ gas: $O_2$ gas:$SiF_4$ gas), or a mixture gas of $SF_6$ gas/$O_2$ gas/$SiF_4$ gas in which the flow ratio of at least one of the $O_2$ gas and the $SiF_4$ gas, using the $SF_6$ gas as a standard, is larger than the ratio of 2:1:1.5 (=$SF_6$ gas:$O_2$ gas: $SF_6$ gas:$SiF_4$ gas). The cases of "B" to "D" in FIG. 5 satisfy the process conditions of the kind of gas and the flow rate of gas of the present embodiment.

The $SF_6$ gas is an example of the fluorine compound gas and the $SiF_4$ gas is an example of the silicon fluoride gas.

As described above, according to the etching method of the embodiment, the under cut of the sidewall of the via can be decreased to provide a good etching shape of the via while retaining the high etching rate by etching based on the optimized kind of gas and flow rate of the gas.

Further, in this embodiment, only the mixture gas consisting of $SF_6$ gas/$O_2$ gas/$SiF_4$ gas may be used as the process gas and gas including such mixture gas and inert-gas such as argon (Ar) gas or the like may be used as the process gas.

(Electric Power of High Frequency for Plasma Generation HF)

Next, relationships between electric power of the high frequency for plasma generation HF, and etching rate and under cut in the main etching step, using the mixture gas of $SF_6$ gas/$O_2$ gas/$SiF_4$ gas, are explained with reference to FIG. 6.

Figure 6:
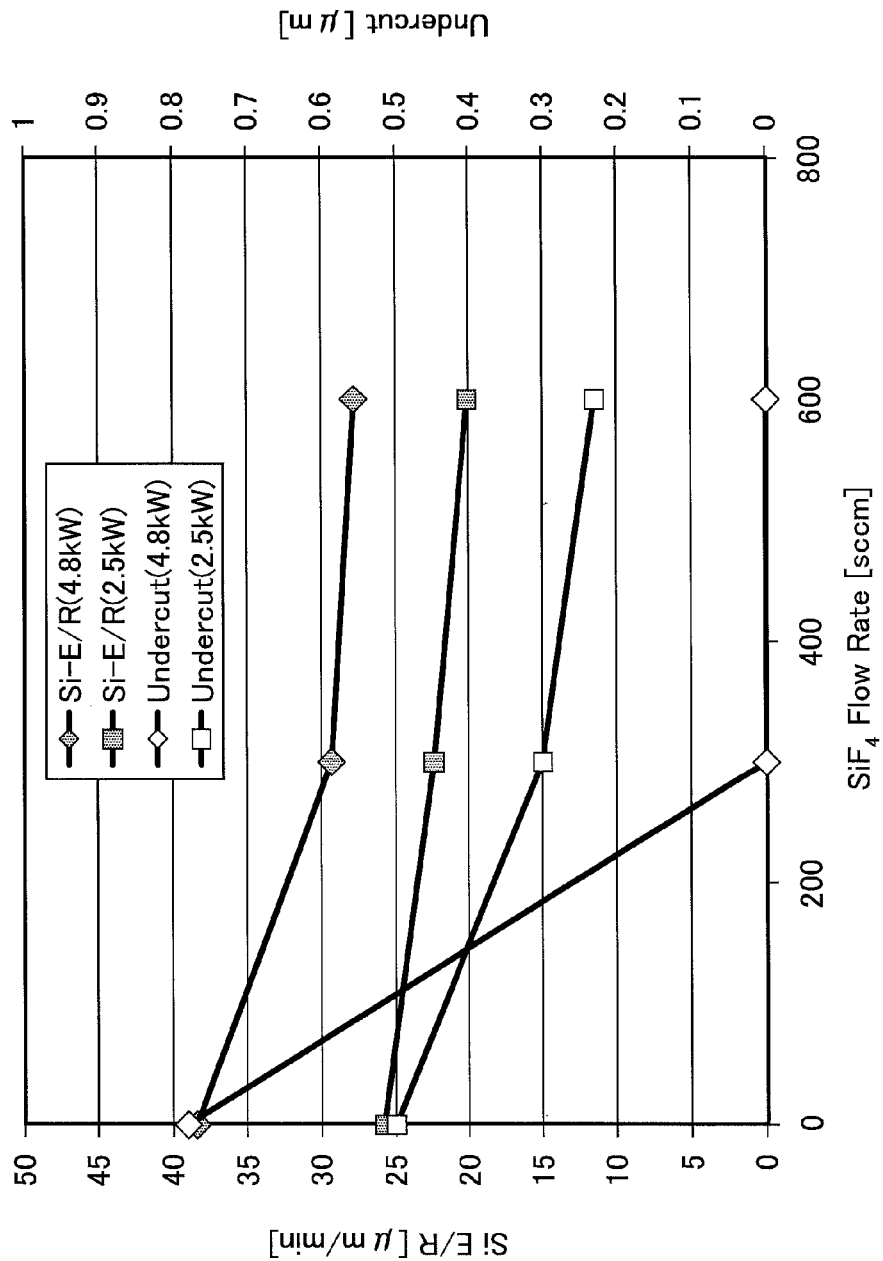
FIG. 6 is a view illustrating a relationship between flow rate of $SiF_4$ gas in the process gas, etching rate and under cut in the main etching step of the embodiment.

In FIG. 6, etching rate of silicon is expressed at left-side vertical axis and under cut is expressed at right-side vertical axis when the flow ratio of the $SiF_4$ gas is varied as expressed at horizontal axis. At this time, the flow rate of the $SF_6$ gas is 400 sccm and the flow rate of the $O_2$ gas is 200 sccm.

According to the result illustrated in FIG. 6, it is revealed that the etching rate of silicon is increased when the electric power of the high frequency for plasma generation HF is 4.8 kW (electric power per unit area: 6.79 W/cm$^2$) compared with the case when the electric power of the high frequency for plasma generation HF is 2.5 kW (electric power per unit area: 3.54 W/cm$^2$). Further, when the flow rate of the $SiF_4$ gas is more than or equal to 150 sccm, it is revealed that the under cut is reduced when the electric power of the high frequency for plasma generation HF is 4.8 kW (electric power per unit area: 6.79 W/cm$^2$) compared with the case when the electric power of the high frequency for plasma generation HF is 2.5 kW (electric power per unit area: 3.54 W/cm$^2$). It is considered that this is because dissociation effect of the $SiF_4$ gas becomes high when the electric power of the high frequency for plasma generation HF is high.

As described above, when the flow rate of the $SiF_4$ gas increases, the flow rate of the $SF_6$ gas is decreased so that the etching rate is also decreased. However, according to the result illustrated in FIG. 6, even when the flow rate of the $SF_6$ gas is decreased by adding the $SiF_4$ gas, by setting the electric power of the high frequency for plasma generation HF as high as about 4.8 kW (electric power per unit area: 6.79 W/cm$^2$), the under cut can be reduced while suppressing the lowering of the etching rate at a minimum amount.

(Frequency of High Frequency for Bias LF)

Figure 7:
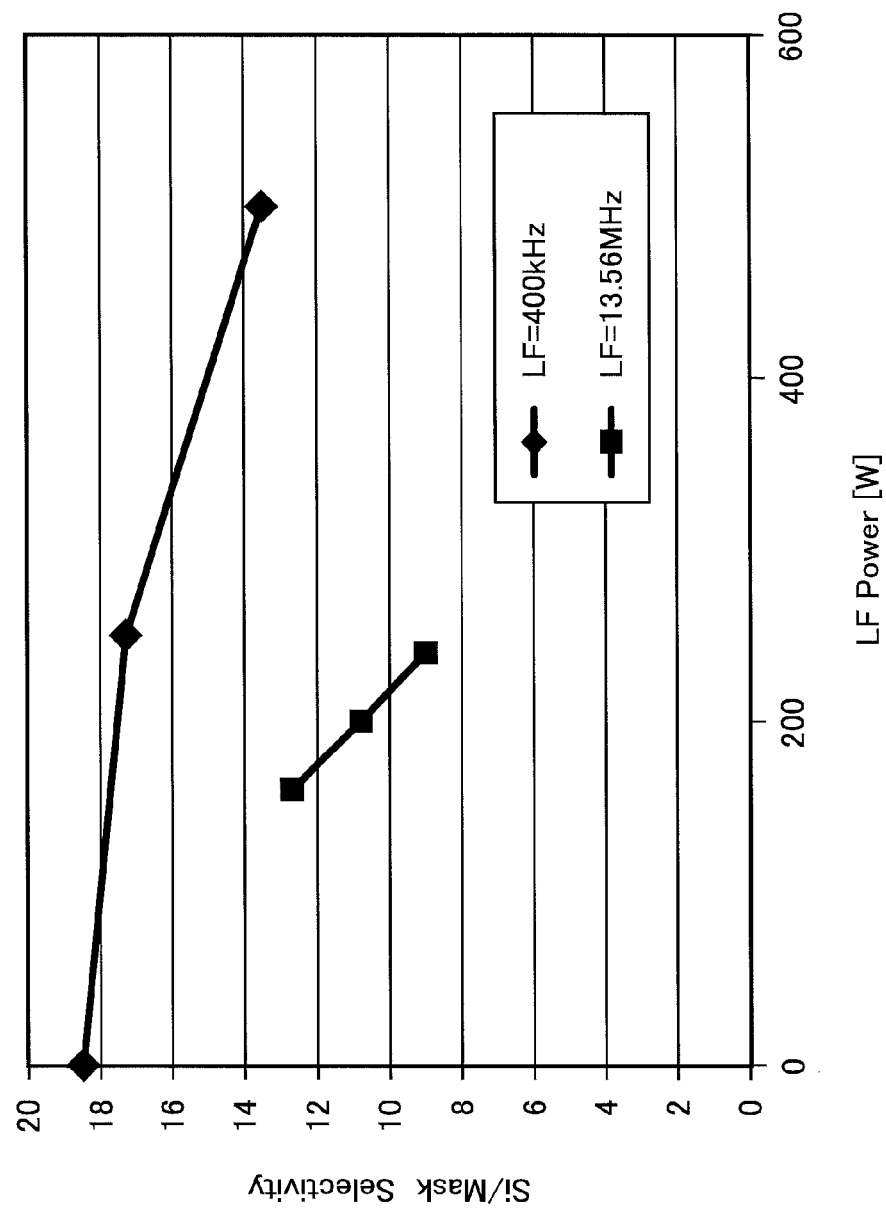
FIG. 7 is a view illustrating a relationship between electric power of high frequency for bias LF and selectivity of a silicon layer with respect to a resist in the main etching step of the embodiment.

Next, selectivity of the silicon layer with respect to the resist when the frequency of the high frequency for bias LF is varied in the main etching step where a mixture gas of $SF_6$ gas/$O_2$ gas/$SiF_4$ gas is used, is explained with reference to FIG. 7. In FIG. 7, horizontal axis indicates the electric power of the high frequency for bias LF and vertical axis indicates selectivity of the silicon layer with respect to the resist. Process conditions are as follows.

Process Condition

<When Frequency of High Frequency for Bias LF is 400 kHz>

Kind of gas and gas flow ratio: $SF_6$ gas/$O_2$ gas/$SiF_4$ gas=2:1:1.5

Pressure: 40 Pa (=300 mT)

Frequency of high frequency for plasma generation HF: 100 MHz

Electric power of high frequency for plasma generation HF: 4.8 kW (electric power per unit area: 6.79 W/cm$^2$)

Frequency of high frequency for bias LF: 400 kHz

<When Frequency of High Frequency for Bias LF is 13.56 MHz>

Kind of gas and gas flow ratio: $SF_6$ gas/$O_2$ gas/$SiF_4$ gas=2:3:3

Pressure: 33.3 Pa (=250 mT)

Frequency of high frequency for plasma generation HF: 100 MHz

Electric power of high frequency for plasma generation HF: 1.5 kW (electric power per unit area: 2.12 W/cm$^2$)

Frequency of high frequency for bias LF: 13.56 MHz

With reference to FIG. 7, when the frequency of the high frequency for bias LF is 400 kHz, selectivity of the silicon layer with respect to the resist is improved compared with a case when the frequency of the high frequency for bias LF is 13.56 MHz.

Figure 12A:
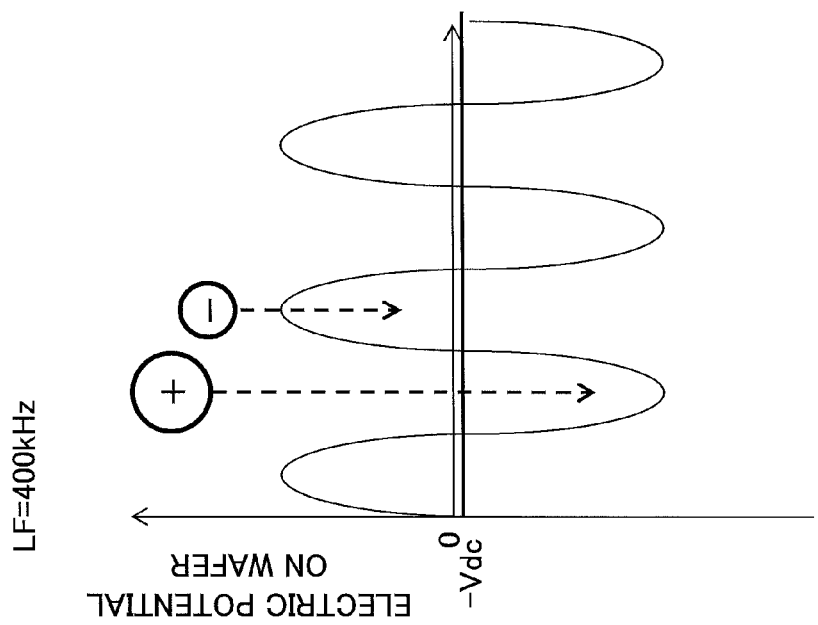
FIG. 12A and FIG. 12B are views for explaining a relationship between frequency of the high frequency for bias LF and notching in the over etching step of the embodiment.

This is because of the following reason. When the frequency of the high frequency for bias LF is 13.56 MHz, as ions cannot follow the high frequency for bias LF (FIG. 12A) and are attracted by −Vdc, which is an average voltage on the wafer (in other words, sheath voltage or self bias), ions hardly reach the bottom portion of the via. On the other hand, electrons can reach above the wafer only when the electric potential of the high frequency for bias LF is positive (FIG. 12A). As such, due to the short attraction time for electrons, positive charges of the ions are accumulated at the bottom portion of the via and react against the ions that are introduced later. Thus, the path of the ions introduced into the via is changed by the ions accumulated at the bottom portion of the via and may not contribute to the etching of the bottom portion of the via. As a result, etching rate is lowered when the frequency of the high frequency for bias LF is 13.56 MHz.

Figure 12B:
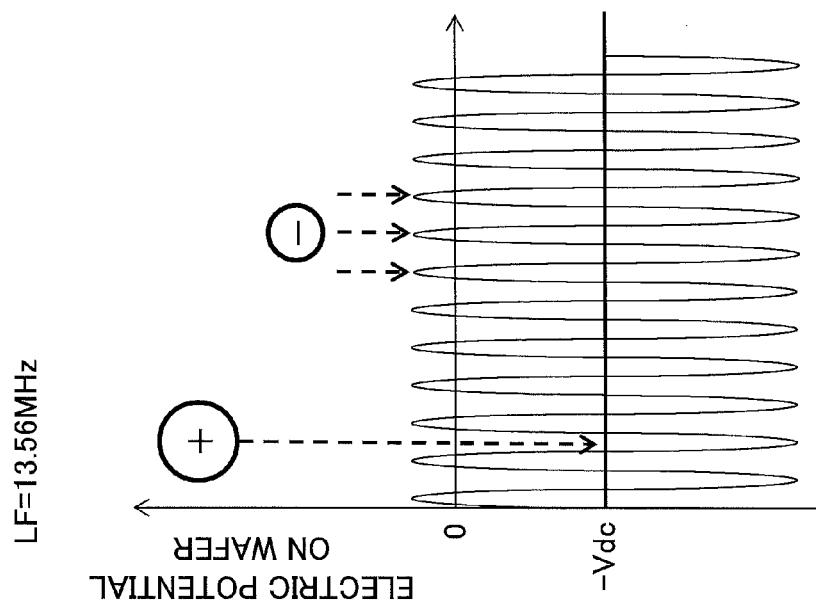

On the other hand, when the frequency of the high frequency for bias LF is 400 kHz, ions can follow the high frequency for bias LF (FIG. 12B). Thus, ions reach the wafer only when the electric potential on the wafer is negative. On the other hand, electrons reach the wafer only when the electric potential on the wafer is positive. As such, as ions and electrons are alternately attracted, electrical charge at the bottom portion of the via is neutralized each time. Thus, at a timing when ions are attracted, positive charges of ions are not accumulated at the bottom portion of the via and ions introduced into the via can contribute to etching at the bottom portion of the via. As a result, etching rate does not decrease when the frequency of the high frequency for bias LF is 400 kHz, compared with a case when the frequency of the high frequency for bias LF is 13.56 MHz.

Thus, the selectivity of the silicon layer with respect to the resist can be increased by plasma etching the substrate while applying the high frequency for bias LF, whose frequency is equal to or less than 400 kHz, in the main etching step, compared with a case when the frequency of the high frequency for bias LF is not lowered. With this, the thickness of the resist can be made thinner.

Although 400 kHz is used as the frequency of the high frequency for bias LF in this embodiment, this is not limited so. The frequency of the high frequency for bias LF may be any frequencies as long as the electric potential on the wafer is actualized to alternately attract ions and electrons, and generally, an optimum frequency may be selected from a range on the order of a few kHz to few MHz.

(Electric Power of High Frequency for Bias LF)

Next, shape of via when the electric power of the high frequency for bias LF is varied in the main etching step where a mixture gas of $SF_6$ gas/$O_2$ gas/$SiF_4$ gas is used, is explained with reference to FIG. 8A and FIG. 8B. Process conditions are as follows.

Process Condition

Kind of gas and gas flow ratio: $SF_6$ gas/$O_2$ gas/$SiF_4$ gas=2:1:1.5
Pressure: 40 Pa (=300 mT)
Frequency of high frequency for plasma generation HF: 100 MHz
Electric power of high frequency for plasma generation HF: 4.8 kW (electric power per unit area: 6.79 W/cm$^2$)
Frequency of high frequency for bias LF: 400 kHz
Electric power of high frequency for bias LF: 0 W in FIG. 8A and 500 W (electric power per unit area: 0.71 W/cm$^2$) in FIG. 8B By visually observing the results illustrated in FIG. 8A and FIG. 8B, when the electric power of the high frequency for bias LF is 0 W, there are variance in the depth or the shape of the vias formed at different positions of the silicon layer on the substrate, and bowing, by which a portion near the center expands, is generated at the via formed at the edge. On the other hand, when the electric power of the high frequency for bias LF is 500 W (electric power per unit area: 0.71 W/cm$^2$), it is revealed that there is uniformity in shape of vias compared with a case when the electric power of the high frequency for bias LF is 0 W.

Thus, uniformities in shape of vias are digitized by inputting the depth of the via at each position in the following equation (1), based on the results of FIG. 8A and FIG. 8B.

$$(\text{the maximum value of the depth of the via}-\text{the minimum value of the depth of the via})/((\text{the maximum value of the depth of the via}+\text{the minimum value of the depth of the via}))/2)\times\frac{1}{2}\times 100\% \quad (1)$$

Figure 8B:
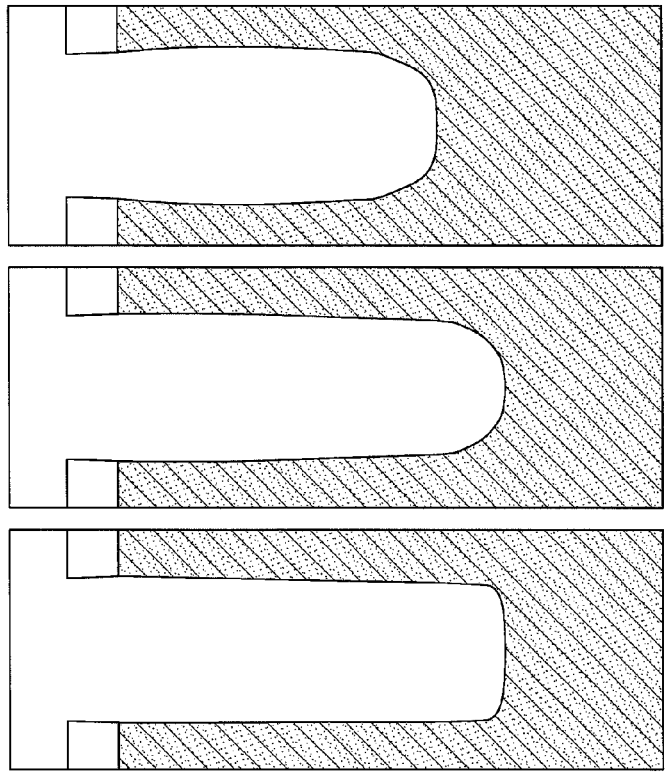
FIG. 8A and FIG. 8B are respective views illustrating a relationship between high frequency for bias LF and etching shape in the main etching step of the embodiment.
Figure 8A:
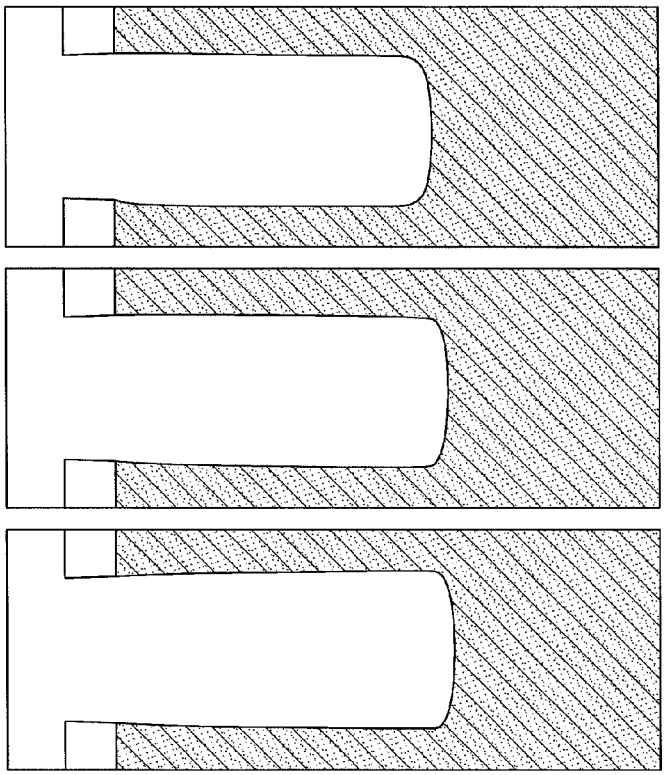

The calculated result of the equation (1) when the electric power of the high frequency for bias LF is 500 W (electric power per unit area: 0.71 W/cm$^2$) as illustrated in FIG. 8B was ±3%, although that for the case when the electric power of the high frequency for bias LF is 0 W as illustrated in FIG. 8A was ±10%. By these results as well, it can be understood that the uniformity in shape of the via is significantly increased when the electric power of the high frequency for bias LF is 500 W (electric power per unit area: 0.71 W/cm$^2$) compared with the case when the electric power of the high frequency for bias LF is 0 W.

As described above, according to the etching method of the embodiment, by performing the etching that satisfies the following process conditions (1) to (3), the high etching rate, uniformity in shape of the via, and suppression of the under cut in the main etching step can be actualized.

(1) Use a mixture gas whose kind of gas is $SF_6$ gas/$O_2$ gas/$SiF_4$ gas with a flow ratio of 2:1:1.5, or the flow ratio of at least one of the $O_2$ gas and the $SiF_4$ gas, using the $SF_6$ gas as a standard, is larger than the ratio of 2:1:1.5.

(2) Increase the electric power of the high frequency for plasma generation HF whose frequency is 100 MHz to be 4.8 kW (electric power per unit area: 6.79 W/cm$^2$), which is higher than usual.

(3) Apply the high frequency for bias LF with a low frequency 400 kHz.

(Pressure)

Figure 9:
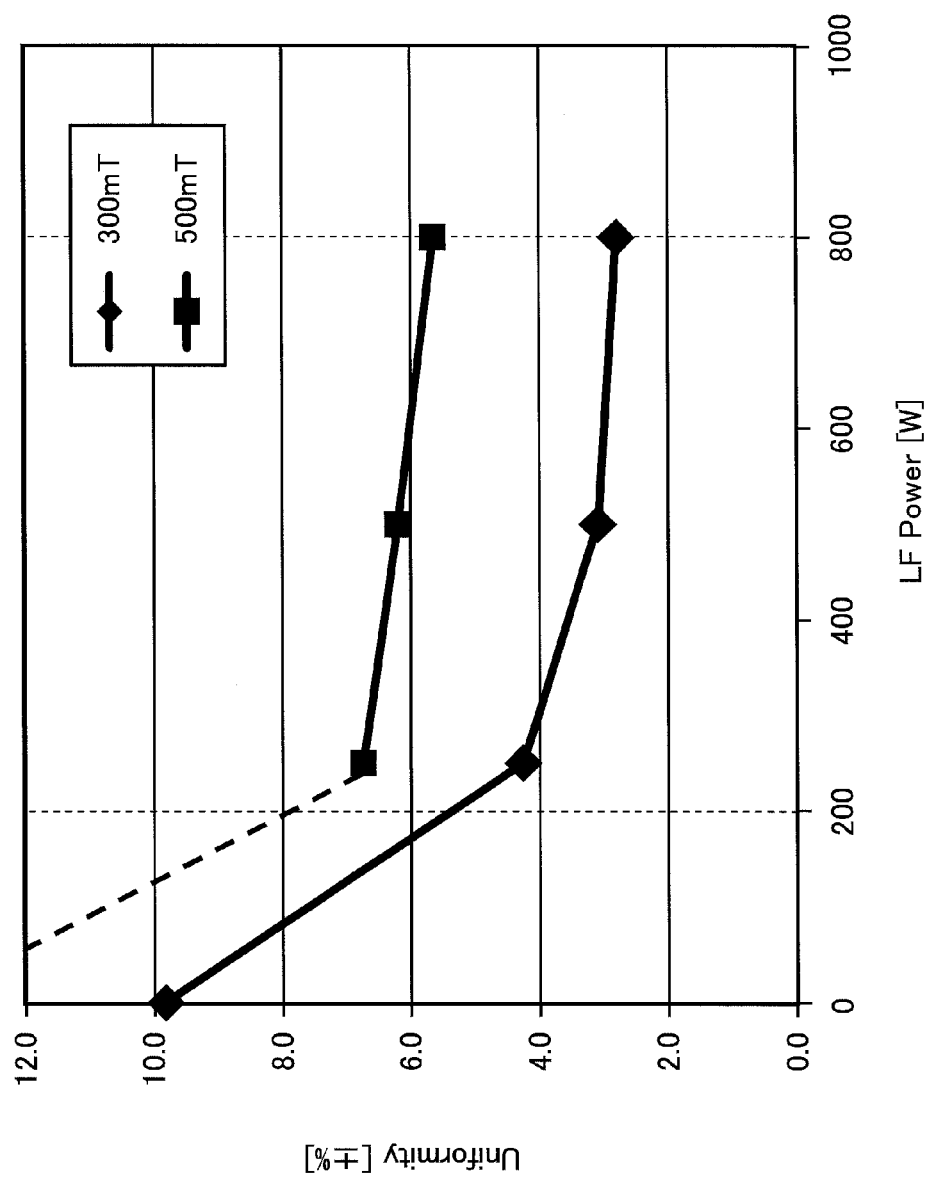
FIG. 9 is a view illustrating a relationship between pressure and uniformity in etching shape in the main etching step of the embodiment.

Next, uniformity in shape of the via when the pressure in the chamber is varied in the main etching step where a mixture gas of $SF_6$ gas/$O_2$ gas/$SiF_4$ gas is used, is explained with reference to FIG. 9. In FIG. 9, horizontal axis indicates the electric power of the high frequency for bias LF and vertical axis indicates uniformity in shape of the via. The uniformity is calculated based on the above equation (1). The process condition at this time is as follows.

Process Condition

Kind of gas and gas flow ratio: $SF_6$ gas/$O_2$ gas/$SiF_4$ gas=2:1:1.5
Frequency of high frequency for plasma generation HF: 100 MHz
Electric power of high frequency for plasma generation HF: 4.8 kW (electric power per unit area: 6.79 W/cm$^2$)
Frequency of high frequency for bias LF: 400 kHz According to the result illustrated in FIG. 9, when the pressure is set to be 66.7 Pa (=500 mT), compared with the case when the pressure is set to be 40 Pa (=300 mT), uniformity in shape is increased. In particular, it is desirable to set the electric power of the high frequency for bias LF within a range from 200 W to 800 W (electric power per unit area: 0.28 W/cm$^2$ to 1.13 W/cm$^2$).

Here, it is preferable to apply the high frequency for bias LF in the main etching step whose frequency is the same as that of the high frequency for bias LF applied in the over etching step. By configuring the same hardware structure in the main etching step and in the over etching step, controllability can be increased and advantage in productivity and cost can be obtained.

For example, in this embodiment, as described below, it is revealed that the optimum LF frequency that can reduce notching is 400 kHz in the over etching step and the optimum LF frequency in the main etching step is also 400 kHz. By using the LF frequency having a frequency as low as 400 kHz in the main etching step and in the over etching step, uniformity in the wafer plane can be actualized only by ion energy and there is no influence on the plasma density.

In the above, the main etching step, in which the silicon layer on the substrate is etched, in the etching method of the embodiment is explained. Next, the over etching step which is performed subsequent to the main etching step is explained.

[Over Etching Step]

In the over etching step, generation of notching is a main problem and the process condition is optimized mainly to suppress notching. First, a mechanism of generation of notching is explained with reference to FIG. 10A to FIG. 10C, and thereafter, optimization of the process condition in the over etching step is explained. FIG. 10A to FIG. 10C are views for explaining the status of the ions and the electrons in the high pressure process of the embodiment.

During the etching process, when the electrons and the ions are introduced into the via, as illustrated in FIG. 10A, the electrons are isotropically introduced while the ions are directionally introduced. Thus, the isotropically introduced electrons hardly reach the bottom portion of the via while the directionally introduced ions easily reach the bottom portion of the via. Thus, positively charged particles are accumulated at the bottom portion of the via due to the easily reached ions. Under this state, the path of the ions introduced into the via is changed by reacting against the positively charged particles at the bottom portion of the via by Coulomb force so that the ions collide the sidewall in the vicinity of the bottom portion of the via. With this, the sidewall in the vicinity of the bottom portion of the via is etched. This etching causing to the sidewall in the vicinity of the bottom portion of the via as such is referred to as "notching". In this embodiment, degree of notching is evaluated based on the amount of etching calculated from the size of the bottom of the via. The amount of etching can be evaluated by measuring the bottom CD of the bottom portion of the via with respect to the top CD of the uppermost portion of the silicon layer. In this embodiment, notching N is expressed by the following equation (B).

$$\text{notching } N \text{ (one side)} = (\text{bottom CD} - \text{top CD})/2 \quad (B)$$

In particular, in the over etching step, notching proceeds under a state where the lower interlayer insulating film 102 is exposed.

(Frequency of High Frequency for Bias LF)

On the other hand, according to the over etching step of the embodiment, the substrate is further performed with plasma etching while applying high frequency for bias having a frequency less than or equal to 400 kHz after the main etching step. At this time, the etching using a mixture gas of $SF_6$ gas/$O_2$ gas/$SiF_4$ gas, same as the main etching step, is performed.

Figure 11A:
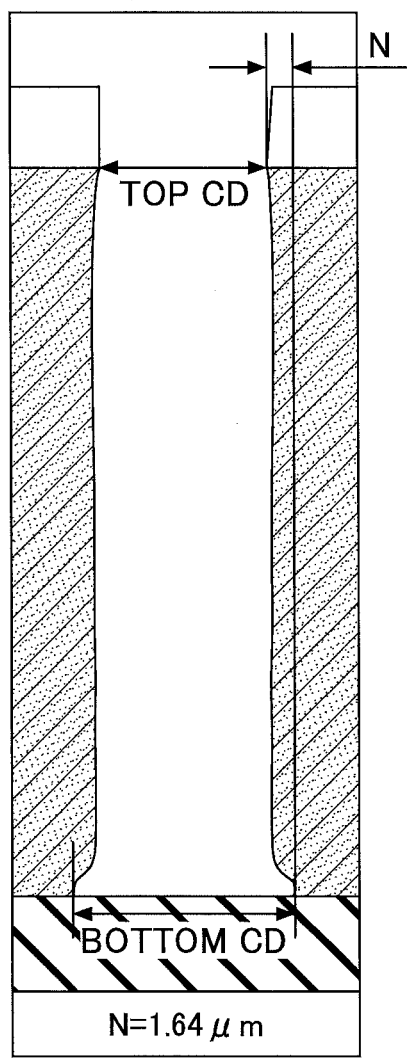
FIG. 11A and FIG. 11B are respective views illustrating a relationship between a frequency of high frequency for bias LF and notching in an over etching step of the embodiment.
Figure 11B:
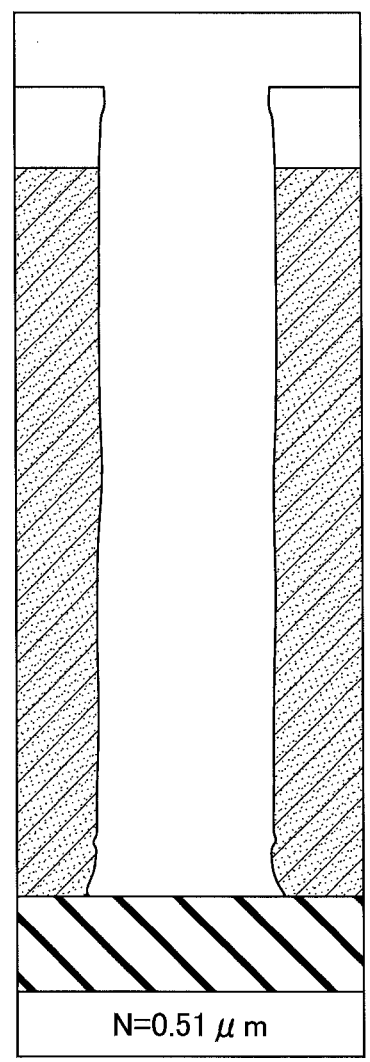

FIG. 11A illustrates an etching result when the frequency of the high frequency for bias LF is set to be 13.56 MHz while FIG. 11B illustrates an etching result when the frequency of the high frequency for bias LF is set to be 400 kHz, in the over etching step. For the case illustrated in FIG. 11A, the notching N is 1.64 μm while for the case illustrated in FIG. 11B, the notching N is 0.51 μm. Thus, it is revealed that generation of the notching N is suppressed for the case when the frequency of the high frequency for bias LF is 400 kHz compared with the case when it is 13.56 MHz.

As described above with reference to FIG. 12A and FIG. 12B, this is because when the frequency of the high frequency for bias LF is 13.56 MHz, the ions cannot follow the high frequency for bias LF (FIG. 12A) and are attracted by −Vdc, which is an average voltage on the wafer, (in other words, sheath voltage or self bias). On the other hand, the electrons can reach the wafer only when the electric potential of the high frequency for bias LF is positive. As such, due to the short attraction time for electrons, positive charges of the ions are accumulated at the bottom portion of the via and react against the ions that are introduced later. Thus, the path of the ions introduced into the via is changed by an influence of Coulomb force to collide the sidewall in the vicinity of the bottom portion of the via and etch the sidewall. The notching proceeds as such.

On the other hand, when the frequency of the high frequency for bias LF is 400 kHz, the ions can follow the high frequency for bias LF and reach the wafer only when the electric potential on the wafer is negative. On the other hand, the electrons reach the wafer only when the electric potential on the wafer is positive. As such, as the ions and the electrons are alternately attracted, electrical charge at the bottom portion of the via is neutralized each time. Thus, at a timing when the ions are attracted, positive charges of the ions are not accumulated at the bottom portion of the via and the path of the ions introduced into the via is not changed at the bottom portion of the via. As a result, when the frequency of the high frequency for bias LF is 400 kHz, compared with the case when it is 13.56 MHz, etching of the sidewall in the vicinity of the bottom portion of the via is suppressed to prevent generation of the notching.

(Electric Power of High Frequency for Bias LF)

Next, shape of via when the electric power of the high frequency for bias LF is varied in the over etching step in which the mixture gas of $SF_6$ gas/$O_2$ gas/$SiF_4$ gas is used is explained with reference to FIG. 13A to FIG. 13C. FIG. 13A to FIG. 13C are respective views illustrating a relationship between the electric power of the high frequency for bias LF and notching in the over etching step of the embodiment.

FIG. 13A to FIG. 13C illustrate generation status of notching when the electric power of the high frequency for bias LF is varied to 60 W (electric power per unit area: 0.085 W/cm$^2$), 90 W (electric power per unit area: 0.13 W/cm$^2$) or 120 W (electric power per unit area: 0.17 W/cm$^2$) while fixing the frequency of the high frequency for bias LF to be 400 kHz.

When the electric power of the high frequency for bias LF is 60 W (electric power per unit area: 0.085 W/cm$^2$) as illustrated in FIG. 13A, it is revealed that notching N (0.96 μm) is generated at the sidewall in the vicinity of the bottom portion of the via. On the other hand, when the electric power of the high frequency for bias LF is 90 W (electric power per unit area: 0.13 W/cm$^2$) and 120 W (electric power per unit area: 0.17 W/cm$^2$) as illustrated in FIG. 13B and FIG. 13C, respectively, notching N is 0.25 μm for the case illustrated in FIG. 13B and 0.10 μm for the case illustrated in FIG. 13C. This means that notching is suppressed or hardly generated.

Thus, it is revealed that it is preferable to satisfy the following process conditions (1) and (2) in the over etching step of the embodiment so that notching is reduced.
(1) Set the frequency of the high frequency for bias LF to be less than or equal to 400 kHz.
(2) Set the electric power of the high frequency for bias LF to be more than or equal to 90 W (electric power per unit area: 0.13 W/cm$^2$).

However, when the electric power of the high frequency for bias LF is too high, there is a possibility that abnormality in etching shape occurs such as the protective film of a deposition of SiFx generated at the sidewall of the via is damaged or the like. Thus, it is preferable to set the electric power of the high frequency for bias LF within a range between 90 W to 120 W (electric power per unit area: 0.13 W/cm$^2$ to 0.17 W/cm$^2$) in which notching is reduced in FIG. 13B and FIG. 13C.

(Pressure)

Finally, shape of via when the pressure in the chamber is varied in the over etching step where a mixture gas of $SF_6$ gas/$O_2$ gas/$SiF_4$ gas is used is explained with reference to FIG. 14A to FIG. 14E. FIG. 14A to FIG. 14E are respective views illustrating a relationship between the pressure and notching in the over etching step of the embodiment.

The process condition at this time is as follows.
Process Condition
Frequency of high frequency for plasma generation HF: 100 MHz
Electric power of high frequency for plasma generation HF: 2.5 kW (electric power per unit area: 3.54 W/cm$^2$)
Frequency of high frequency for bias LF: 400 kHz Electric power of high frequency for bias LF: 150 W (electric power per unit area: 0.21 W/cm$^2$)
Kind of gas: $SF_6$ gas/$O_2$ gas/$SiF_4$ gas/HBr gas=130/150/450/140 sccm In FIG. 14A to FIG. 14E, generation statuses of notching when the pressure in the chamber is varied to 36 Pa (=270 mT)

in FIG. 14A, 53 Pa (=400 mT) in FIG. 14B, 66.7 Pa (=500 mT) in FIG. 14C, 80 Pa (=600 mT) in FIG. 14D and 86.7 Pa (=650 mT) in FIG. 14E.

According to the results illustrated in FIG. 14A to FIG. 14E, notching N is 2.29 μm in FIG. 14A, 0.82 μm in FIG. 14B, and less than 0.20 μm in FIG. 14C to FIG. 14E. With this, it can be understood that notching is hardly generated when the pressure in the chamber is more than or equal to 66.7 Pa (=500 mT).

Mechanism of the pressure in the chamber and generation of the notching is explained with reference to FIG. 10A to FIG. 10C. As described above, generally, electrons are isotropically introduced into the via while positive ions are directionally introduced into the via and the positive ions easily reach the bottom portion of the via while electrons hardly reach the bottom portion of the via. Thus, the bottom portion of the via is charged up with positive electrical charge so that the path of the positive ions is changed at the bottom portion of the via to generate notching.

However, in the high pressure process, in which the pressure in the chamber is more than or equal to 66.7 Pa (=500 mT), frequency of the positive ions to collide with other molecules increases and positive ions that behave isotropically after losing directivity by the collision increase. The positive ions that behave isotropically do not easily reach the bottom portion of the via and the positively charged particles do not easily accumulated at the bottom portion of the via to suppress the charge up of the bottom portion of the via.

Further, in the high pressure process where the pressure in the chamber is more than or equal to 66.7 Pa (=500 mT), negatively charged negative ions, which are obtained from electrons that collide with other molecules, increase. As the negative ions have directivity, the negative ions easily reach the bottom portion of the via. With this, charge up of the bottom portion of the via is further suppressed. As a result, generation of notching is suppressed.

Thus, it is preferable to set the pressure in the chamber to be more than or equal to 66.7 Pa (=500 mT) in the over etching step of the embodiment. Further, it is preferable to set the pressure condition such that the pressure in the chamber in the over etching step becomes higher than the pressure in the chamber in the main etching step. This is because it is necessary to retain the etching rate high in the main etching step while it is preferable to reduce generation of notching even when the etching rate is a bit lowered in the over etching step. However, if the pressure is too high, collision of ions and electrons often occurs so that the possibility that the etching is stopped increases.

The etching method of the embodiment is explained in the above. According to the etching method, the process conditions are optimized for the main etching step and the over etching step for the substrate obtained by bonding the substrate and the support substrate after the substrate is reversed in upward and downward directions. With this, the substrate on which the semiconductor device is formed can be appropriately etched.

Although a preferred embodiment of the etching method of the embodiment has been specifically illustrated and described, it is to be understood for the skilled in the art having a normal knowledge about the technology of the etching method of the embodiment that minor modifications may be made therein without departing from the spirit and scope of the invention as defined by the claims.

For example, the substrate of the embodiment may be a disciform wafer or may be a rectangular substrate.

According to the embodiment, a substrate, to be processed, on which a semiconductor device is formed can be appropriately etched.

What is claimed is:

1. A method of etching a substrate including a silicon layer, a semiconductor device formed at a front surface of the silicon layer and an insulating film formed at the front surface of the silicon layer and supported by a support substrate provided at a front surface side of the substrate, the method comprising:
    a main etching step of etching the silicon layer from a back surface of the silicon layer by plasma using a mask having a predetermined pattern for forming a Through-Silicon Via that penetrates through the silicon layer, in which the silicon layer is etched before the insulating film is exposed at a bottom portion of an etched portion of the silicon layer and plasma is generated by supplying a process gas including a mixed gas whose flow ratio of fluorine compound gas, oxygen gas and silicon fluoride gas is 2:1:1.5 or a process gas including a mixed gas in which at least the ratio of one of the oxygen gas and the silicon fluoride gas, using the fluorine compound gas as a standard, is larger than the ratio of 2:1:1.5, and the silicon layer is etched by the generated plasma while applying a high frequency for bias whose frequency is less than or equal to 400 kHz to a susceptor on which the substrate is mounted; and
    an over etching step, after the main etching step, in which the silicon layer is further etched to expose the insulating film at the bottom portion of the etched portion of the silicon layer with an etching rate of the silicon layer lower than that in the main etching step by plasma while applying a high frequency for bias whose frequency is the same as that of the high frequency for bias applied in the main etching step to the susceptor to form the Through-Silicon Via in the silicon layer,
    wherein in the main etching step, the substrate is etched by the plasma while applying the high frequency for bias whose electric power is within a range of 200 W to 800 W,
    wherein in the over etching step, the substrate is etched by the plasma while applying the high frequency for bias whose electric power is within a range of 90 W to 120 W, and wherein in the over etching step, pressure in a chamber in which the over etching step is performed is set to be more than or equal to 66.7 Pa.

2. The etching method according to claim 1, wherein the fluorine compound gas is sulfur hexafluoride ($SF_6$) gas and the silicon fluoride gas is silicon tetrafluoride ($SiF_4$) gas.

3. The etching method according to claim 1, wherein in the main etching step, the substrate is etched by the plasma while applying the high frequency for bias whose electric power per unit area is within a range of 0.28 W/cm$^2$ to 1.13 W/cm$^2$.

4. The etching method according to claim 1, wherein in the over etching step, the substrate is etched by the plasma while applying the high frequency for bias whose electric power per unit area is within a range of 0.13 W/cm$^2$ to 0.17 W/cm$^2$.

5. The etching method according to claim 1, wherein in the over etching step, pressure in the chamber is set to be higher than that in the main etching step.

6. The etching method according to claim 1, wherein in the main etching step, pressure in the chamber is set to be 66.7 Pa.

7. The etching method according to claim 1, wherein in the over etching step, the insulating film remains at the bottom portion of the Through-Silicon Via so that a through electrode is formed on the insulating film in the Through-Silicon Via.

* * * * *